(12) United States Patent
Chiang et al.

(10) Patent No.: US 12,467,578 B2
(45) Date of Patent: Nov. 11, 2025

(54) DISPLACEMENT CONTROL DEVICE FOR SEISMIC EVENTS

(71) Applicant: Taiwan Semiconductor Manufacturing Company, LTD., Hsinchu (TW)

(72) Inventors: Chuan-Chieh Chiang, Hsinchu (TW); Chun-Jung Hsu, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 68 days.

(21) Appl. No.: 18/511,070

(22) Filed: Nov. 16, 2023

(65) Prior Publication Data

US 2024/0084954 A1 Mar. 14, 2024

Related U.S. Application Data

(63) Continuation of application No. 17/678,434, filed on Feb. 23, 2022, now Pat. No. 11,852,291.

(51) Int. Cl.
*F16M 9/00* (2006.01)
*H01L 21/67* (2006.01)
*F27B 17/00* (2006.01)

(52) U.S. Cl.
CPC ......... *F16M 9/00* (2013.01); *H01L 21/67109* (2013.01); *F27B 17/0025* (2013.01)

(58) Field of Classification Search
CPC .. F16M 9/00; H01L 21/67109; F27B 17/0025
See application file for complete search history.

(56) References Cited

U.S. PATENT DOCUMENTS 2,359,036 A * 9/1944 Harper ................. B60G 99/002
296/35.1
5,573,220 A * 11/1996 Whittaker ............. F16F 15/085
52/126.6
6,085,473 A * 7/2000 Teramachi .............. F16F 15/02
52/167.4

(Continued)

FOREIGN PATENT DOCUMENTS

CN 204226543 U * 3/2015
CN 106195102 A * 12/2016 ............. F16F 15/02

(Continued)

*Primary Examiner* — Eret C Mcnichols
(74) *Attorney, Agent, or Firm* — Lippes Mathias LLP

(57) ABSTRACT

A support platform is configured to support at least a portion of the weight of an associated semiconductor manufacturing tool, such as a furnace, when the associated semiconductor manufacturing tool is disposed on the support platform. The support platform comprises a base, a support plate disposed on the base and configured to move respective to the base, a brake plate arranged in fixed position respective to the base, and a damper secured to one of the support plate or the brake plate and frictionally engaging a track of the other of the support plate or the brake plate. The track includes a central track portion and inclined track portions extending away from the central track portion on respective first and opposite second sides of the central track portion. The inclined track portions are each inclined with respect to the central track portion.

20 Claims, 7 Drawing Sheets

(56) References Cited

U.S. PATENT DOCUMENTS

| | | | | |
|---|---|---|---|---|
| 6,123,313 | A * | 9/2000 | Otsuka | E04H 9/023 248/580 |
| 6,134,850 | A | 10/2000 | Hui et al. | |
| 6,164,022 | A * | 12/2000 | Ishikawa | B23Q 1/48 52/167.4 |
| 6,367,390 | B1 | 4/2002 | Okubo et al. | |
| 6,505,806 | B1 * | 1/2003 | Glaesener | F16M 7/00 248/677 |
| 6,725,612 | B2 * | 4/2004 | Kim | E04H 9/023 52/167.1 |
| 6,820,380 | B2 * | 11/2004 | Tsai | E01D 19/04 52/167.7 |
| 7,237,364 | B2 * | 7/2007 | Tsai | F16F 15/02 52/167.6 |
| 7,338,035 | B2 * | 3/2008 | Tsai | E02D 27/34 267/136 |
| 7,472,518 | B2 * | 1/2009 | Tsai | E04H 9/023 52/167.6 |
| 7,814,712 | B2 * | 10/2010 | Tsai | E04H 9/023 52/167.4 |
| 8,113,478 | B2 * | 2/2012 | Hsiao | B65D 19/38 248/221.11 |
| 8,307,586 | B2 * | 11/2012 | Tsai | E04H 9/023 248/562 |
| 9,121,421 | B2 | 9/2015 | Huggler et al. | |
| 9,175,468 | B1 * | 11/2015 | Tsai | E01D 19/04 |
| 10,711,859 | B2 * | 7/2020 | Mitsch | F16F 7/1022 |
| 11,108,341 | B2 * | 8/2021 | Hino | G03B 21/2033 |
| 11,193,294 | B2 * | 12/2021 | Lu | E04H 9/023 |
| 11,821,234 | B2 * | 11/2023 | Hsu | E04H 9/023 |
| 11,852,291 | B2 * | 12/2023 | Chiang | H01L 21/67109 |
| 12,000,455 | B2 * | 6/2024 | Ho | H01L 21/67288 |
| 12,209,632 | B2 * | 1/2025 | De Laet | F16F 15/1435 |
| 12,234,877 | B2 * | 2/2025 | Sawatsky | B22F 12/38 |
| 12,241,275 | B2 * | 3/2025 | Yu | E04H 9/023 |
| 2003/0196501 | A1 * | 10/2003 | Doornbos | F16F 7/00 74/411 |
| 2004/0252287 | A1 * | 12/2004 | Binnard | G03F 7/70716 355/75 |
| 2004/0261333 | A1 | 12/2004 | Whittaker | |
| 2006/0048462 | A1 * | 3/2006 | Huang | E04H 9/023 52/167.5 |
| 2008/0098671 | A1 * | 5/2008 | Tsai | E04H 9/023 52/167.6 |
| 2011/0227265 | A1 | 9/2011 | Fujita et al. | |
| 2012/0201633 | A1 * | 8/2012 | Otogawa | H01L 21/67017 414/226.05 |
| 2019/0284800 | A1 * | 9/2019 | Cynober | E04H 9/0215 |
| 2022/0251863 | A1 * | 8/2022 | Hsu | E04H 9/023 |
| 2023/0279917 | A1 * | 9/2023 | Seeley | F16F 7/1022 188/380 |

FOREIGN PATENT DOCUMENTS

| | | | |
|---|---|---|---|
| JP | H11247925 A | * | 9/1999 |
| JP | 2007297820 A | * | 11/2007 |

* cited by examiner

DISPLACEMENT CONTROL DEVICE FOR SEISMIC EVENTS

This application is a continuation of U.S. Ser. No. 17/678,434 filed Feb. 23, 2022, now issued as U.S. Pat. No. 11,852,291, which is incorporated herein by reference in its entirety.

BACKGROUND

The following relates to seismic disturbance control arts, semiconductor processing equipment arts, and to related arts.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
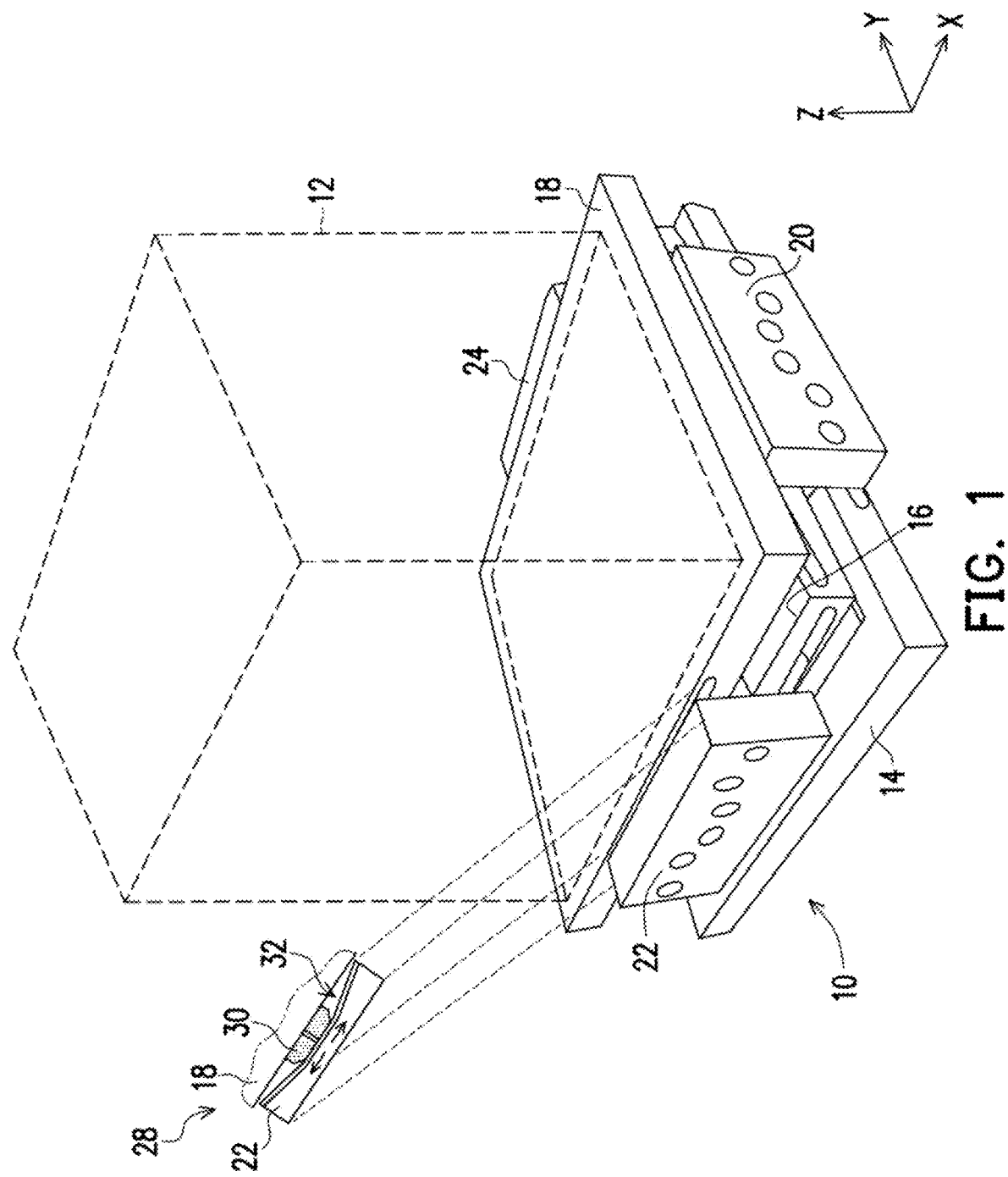
FIG. 1 diagrammatically illustrates a semiconductor manufacturing tool installation including a semiconductor manufacturing tool supported by a support platform that includes displacement control assemblies for controlling displacement of the semiconductor manufacturing tool in respective X and Y directions.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Modern integrated circuit (IC) chips often have submicron or smaller feature sizes, and the silicon wafers that form the substrate for most IC chips are fragile. Semiconductor fabrication tools used in semiconductor foundries are expensive and high precision systems that are susceptible to damage by seismic vibrations during earthquakes. Moreover, many important semiconductor foundries are located in regions of high earthquake prevalence. For example, many semiconductor foundries in Asia and the United States are located along the so-called "Pacific Ring of Fire" which partially encircles the Pacific Ocean, and along which geological tectonic plate activity leads to a high prevalence of volcanic and earthquake activity. Hence, displacement control devices that provide effective shielding of semiconductor manufacturing tools from the effects of seismic vibration are beneficial.

One approach for displacement control is to employ passive dampers that provide frictional dampening of the displacement. This provides relatively simple mechanical dampening that does not employ accelerometers or other electronic sensors and their concomitant increase in complexity. However, a difficulty with passive dampeners is that the friction force is difficult to optimize for a wide range of displacement magnitudes. If the friction force is too high, there may be a substantial impulse force conveyed to the tool as the static friction of the damper is broken. On the other hand, if the friction force is too low, it may be insufficient to prevent oscillatory seismic vibrations from being conveyed to the tool. In an extreme case, the seismic displacement may move the damper through the full stroke length of the damper track leading to engagement of an impulse force as the damper hits the end of the track or runs off the track.

Disclosed herein are support platforms for semiconductor fabrication tools or other seismic vibration-sensitive equipment, which include displacement control assemblies for suppressing seismic displacement of the supported tool or equipment during an earthquake. The disclosed displacement control employs passive dampers, and advantageously provide displacement control in which the displacement dampening increases with increasing displacement magnitude. The disclosed displacement control also biases the damper back to a central position along the track, which can advantageously recenter the damper in the track after the seismic disturbance dissipates.

With reference to FIG. 1, a support platform 10 is configured to support at least a portion of the weight (and in some embodiments the entire weight) of a semiconductor manufacturing tool 12 when the semiconductor manufacturing tool 12 is disposed on the support platform 10 as shown in FIG. 1. The semiconductor manufacturing tool 12 is diagrammatically shown by dashed lines in FIG. 1 to reveal the underlying support platform 10. The semiconductor manufacturing tool 12 may, for example, be a furnace, e.g. a semiconductor wafer furnace sized to receive and thermally heat or anneal 200 mm or 300 mm or larger semiconductor wafers. More generally, the semiconductor manufacturing tool 12 may be another type of tool such as a lithography developer system, a chemical vapor deposition system or other type of deposition system, or so forth. Even more generally, it is contemplated for the semiconductor manufacturing tool 12 to be replaced by another type of equipment or tool.

In the illustrative example there is a single support platform 10 which supports the entire weight of the semiconductor manufacturing tool 12. However, in other embodiments (not shown), the weight of the semiconductor manufacturing tool might be borne by two or more such support tools. For example, a semiconductor manufacturing tool having a rectangular footprint might have four support platforms, one at each of the four corners of the semiconductor manufacturing tool. In this case, each support plate would bear one-fourth of the total weight of the semiconductor manufacturing tool.

The support platform 10 includes a base 14 which is designed to be placed onto a floor of the semiconductor foundry. The base 14 may be placed directly onto the floor, or alternatively could be placed onto a weight-distributing steel plate, support pedestal, or the like that in turn is disposed on the floor. The base 14 carries the weight of the semiconductor manufacturing tool 12, and the base 14 is expected to remain stationary during normal operations of the tool 12. At least one support plate, and in the illustrative embodiment two support plates 16 and 18, are configured to move respective to the base 14. To this end, the support plates 16, 18 are stacked on top of the base 14, with low-friction movement provided by ball bearings, rollers, a lubricant, various combinations thereof or so forth (features not shown) interposed between the base 14 and the lower support plate 16 and between the lower support plate 16 and the upper support plate 18. Two plates 16 and 18 are employed in the illustrative support platform 10 to provide for displacement in an X-direction and a Y-direction—where these directions refer to the Cartesian X-Y-Z coordinate system diagrammatically shown in FIG. 1. It is noted here that unless otherwise indicated herein, phrases such as "movement in the X-direction", "movement in the Y-direction" or the like are intended to encompass bidirectional movement. For example, "movement in the X-direction" encompasses movement in either the +X direction or in the −X direction (or, more commonly during a seismic event, a back-and-forth movement alternating between −X direction movement and +X direction movement). In the illustrative example of FIG. 1, the lower support plate 16 is configured to move in the Y-direction respective to the base 14, while the upper support plate 18 is configured to move in the X-direction respective to the base 14. Due to the stacked arrangement of the support plates 16, 18 on the base 14, the weight of the semiconductor manufacturing tool 12 is borne by the support plates 16, 18 and by the base 14.

The support platform 10 further includes at least one brake plate, and in the illustrative embodiment four brake plates 20, 22, 24. (The fourth brake plate is occluded from view by the upper support plate 18 in the perspective view of FIG. 1, and hence is not indicated by a reference number). The brake plate 20 and the occluded brake plate are secured to the base 14 (or at least are in fixed position respective to the base 14) and engage the lower support plate 16. The brake plates 22 and 24 are secured to the lower support plate 16 engage the upper support plate 18. More particularly, the brake plate 20 and the occluded brake plate engage the lower support plate 16 on opposite sides and form a guide that limits movement of the lower support plate 16 to movement in the Y-direction. Similarly, the brake plates 22 and 24 engage the upper support plate 18 on opposite sides and form a guide that limits movement of the upper support plate 18 to movement in the X-direction.

In addition to serving as guides for the support plates 16, 18, the brake plates 20, 22, 24 also serve to damp the displacement of the guided support plates 16, 18. To this end, dampers 30 are secured to the sides of the support plates 16, 18. The dampers 30 are frictionally engaged with tracks of the brake plates 20, 22, 24. This is diagrammatically illustrated in FIG. 1 by way of a single example for the upper support plate 18 and the brake plate 22, where an inset 28 if FIG. 1 diagrammatically illustrates a damper 30 secured to the support plate 18 and frictionally engaged with a track 32 of the brake plate 22. The materials of the damper 30 and of the brake plate 22 and the force of engagement between the damper 30 and the track 32 are suitably chosen to provide a desired coefficient of friction between the damper 30 and the track 32. In a nonlimiting illustrative example, the brake plate 22 comprises a stainless steel such as SUS316 steel, and the damper 30 comprises an engineering plastic such as a polyamide material, a polycarbonate material, a nylon material, poly(methyl methacrylate (PMMA), acrylonitrile butadiene styrene (ABS), or the like.

FIG. 1 thus diagrammatically illustrates a semiconductor manufacturing tool installation that includes the semiconductor manufacturing tool 12 supported by the support platform 10. In this embodiment, the support platform 10 includes displacement control assemblies for controlling displacement of the semiconductor manufacturing tool in respective X and Y directions. Specifically, a lower displacement control assembly is formed by the brake plate 20 engaging the lower support plate 16 by way of a damper secured to the support plate 16 that frictionally engages a track of the brake plate 20, and similarly for the occluded brake plate on the other side of the lower support plate 16. An upper displacement control assembly is formed by the brake plate 22 engaging the upper support plate 18 by way of the illustrative damper 30 secured to the support plate 18 that frictionally engages the brake plate 22, and similarly for the brake plate 24 on the other side of the upper support plate 18.

While in the illustrative embodiment the damper 30 is secured to the support plate 18 and the brake plate 22 comprises the track 32, in other embodiments the damper may be secured to the brake plate and frictionally engage a track of the support plate. More generally, a damper is secured to one of the support plate or the brake plate that frictionally engages a track of the other of the support plate or the brake plate.

In the support platform 10 of FIG. 1, the brake plates 20, 22, 24 serve a dual role: they function as guides for guiding the movement of the upper support plate 18 and the lower support plate 16 along respective X- and Y-directions; and they act as brakes for damping said movement. However, these functions can be separated into separate physical components or subsystems. For example, the support platform could include guides for guiding the movement of the support plates, and physically separate brake plates for damping said movement. Moreover, while in the support platform 10 of FIG. 1 each support plate has two brake plates (namely upper support plate 18 has brake plates 22 and 24 while lower support plate 16 has brake plates 20 and the occluded fourth brake plate), it is contemplated to have only a single brake plate for each support plate. Furthermore, while the illustrative brake plates 20, 22, 24 engage sides of the support plates 16, 18, the engagement could be at other surfaces of the support plates.

Figure 2:
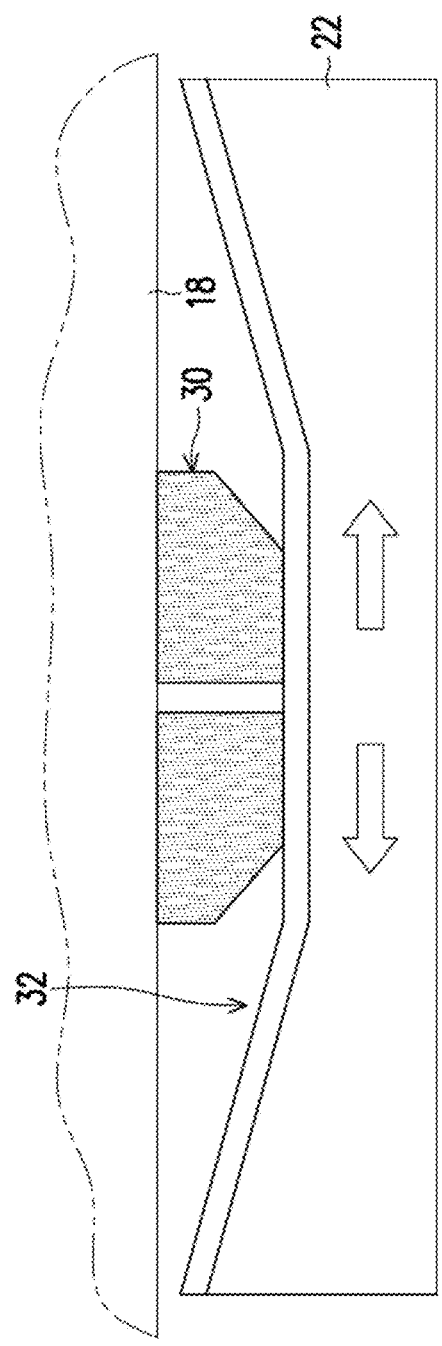
FIG. 2 diagrammatically illustrates a side-sectional view of portions of a support plate and a brake plate, with a damper secured to the support plate and frictionally engaging a track of the brake plate.

With reference to FIG. 2, an enlarged view of inset 28 of FIG. 1 is shown, presenting a side sectional view of (the proximate edge of) the support plate 18 and the brake plate 22, with the damper 30 secured to the support plate 18 and frictionally engaging the track 32 of the brake plate 22. As previously noted, in an alternative arrangement the damper 30 could be secured to the brake plate and the track 32 could be of the support plate.

Figure 3:
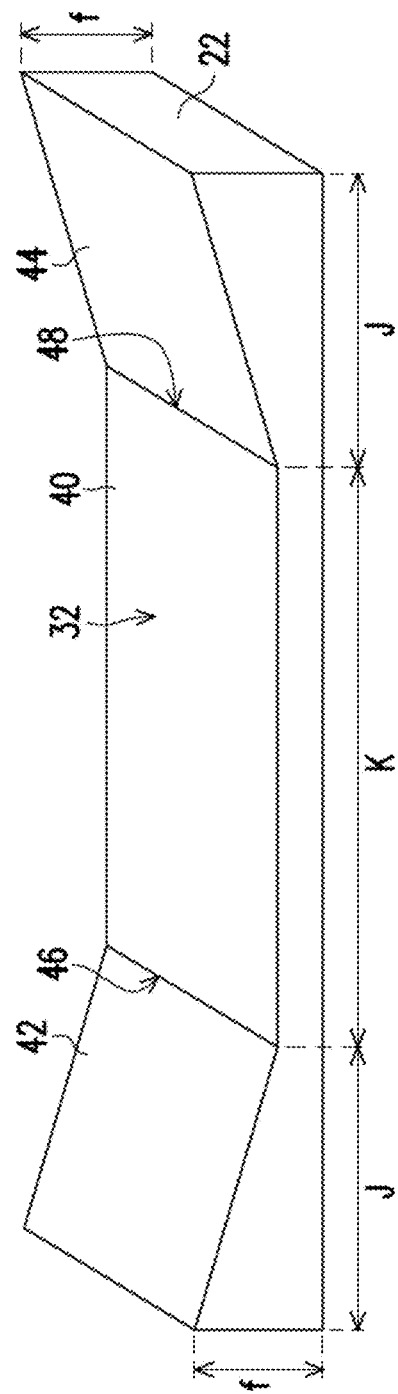
FIGS. 3 and 4 diagrammatically illustrate the track of FIG. 2 in perspective view (FIG. 3) and side-sectional view (FIG. 4).
Figure 4:
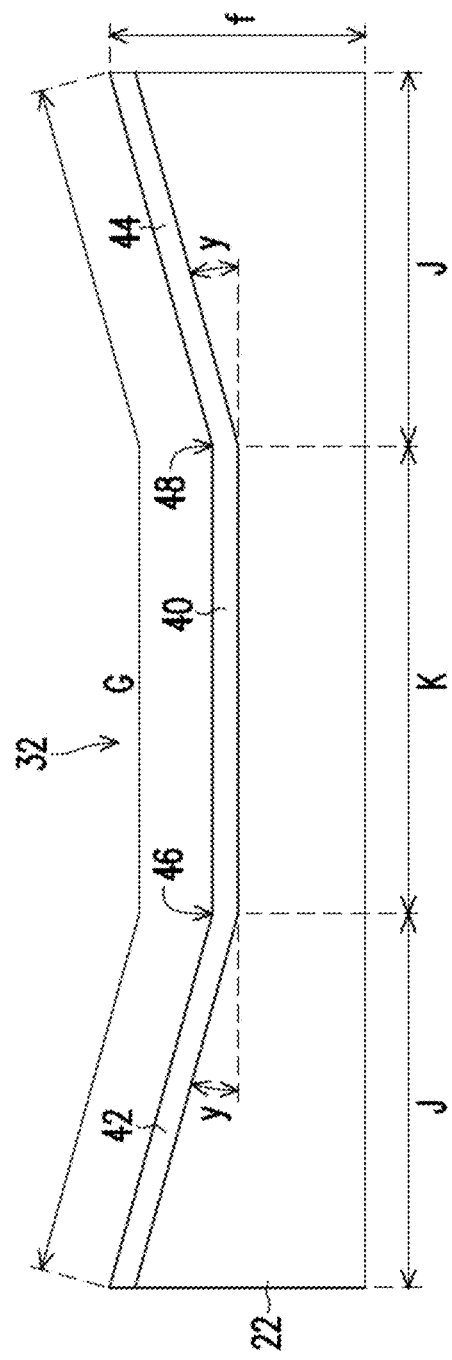

With continuing reference to FIG. 2 and with further reference to perspective and side sectional views of the track 32 shown in respective FIGS. 3 and 4, the track 32 of the brake plate 22 includes a central track portion 40 and inclined track portions 42 and 44 extending away from the central track portion 40 on respective first side 46 and opposite second side 48 of the central track portion. The inclined track portions 42 and 44 are each inclined with respect to the central track portion 40. An inclination of each inclined track portion 42, 44 is effective to increase frictional force between the damper 30 and the track 32 with increasing distance of the damper 30 away from the central track portion 40. Specifically, the inclination of each of the inclined portions 42, 44 brings the track closer to the damper 30 with increasing distance of the damper 30 away from the central track portion 40, thereby reducing the damper-to-track distance and increasing the force of engagement between the damper 30 and the track 32 so as to increase the frictional force.

The illustrative central track portion 40 is a planar surface, the illustrative inclined track portion 42 is a planar surface providing a linear inclination, and the illustrative inclined track portion 44 is likewise a planar surface providing a linear inclination. However, the inclination can be otherwise than linear (see the example of FIG. 9). In the illustrative example as labeled in FIGS. 3 and 4, the track 32 of the brake plate 22 has a length G, the central track portion 40 has a length K, and the projection of each inclined track portion 42, 44 onto the plane of the central track portion 40 has a length J. The brake plate 22 in this embodiment has a thickness f. In some nonlimiting illustrative embodiments, K>J>f. In some nonlimiting embodiments, f is greater than or equal to 3 mm. Furthermore, the inclination of the inclined track portion 42 with respect to the central track portion 40 is quantified by an angle y, and likewise the inclined track portion 44 is inclined with respect to the central track portion 40 at the angle y. In some non-limiting illustrative embodiments, the angle y is 5 degrees or less. The inclination of the inclined track portion 42 is toward the support plate 18, so as to reduce the separation between the support plate 18 and the track 32 as the damper moves further away from the end 46 of the central track portion 32 along the inclined track portion 42. The reduced separation increases the force between the damper 30 and the track 32, thus increasing the frictional force. Likewise, the inclination of the inclined track portion 44 is toward the support plate 18, so as to reduce the separation between the support plate 18 and the track 32 as the damper moves further away from the end 48 of the central track portion 32 along the inclined track portion 44. The reduced separation again increases the force between the damper 30 and the track 32, thus increasing the frictional force.

Figure 5:
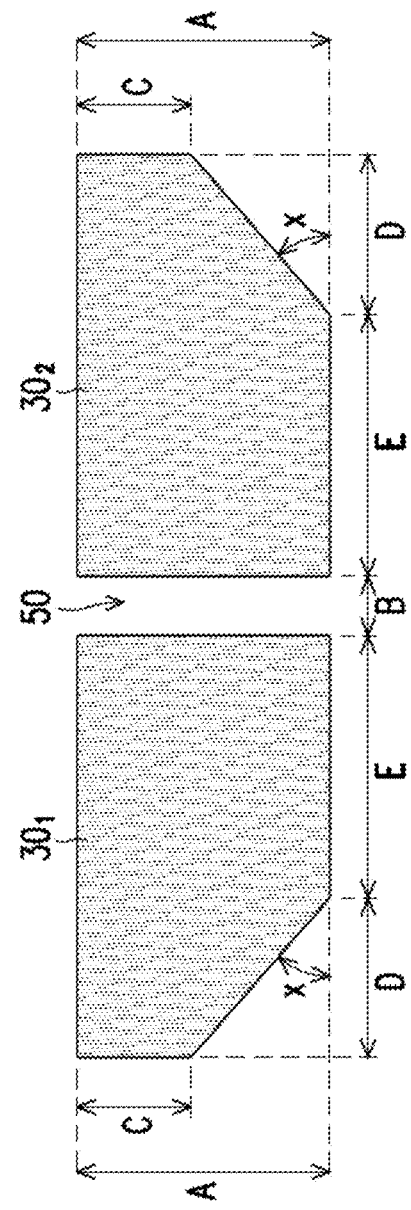
FIG. 5 diagrammatically illustrates the damper of FIG. 2 in side-sectional view.

With continuing reference to FIG. 2 and with further reference to FIG. 5, the illustrative damper 30 comprises two portions: a damper portion 301 and a damper portion 302, separated by a gap 50. Each damper portion 301 and 302 has a pentagonal cross-section with sides of respective lengths A, B, C, D, and E as labeled in FIG. 5. Each damper portion 301 and 302 has a surface including a central surface portion of the length E and an inclined surface portion extending away from the central surface portion. The inclined surface portion has a projected length D onto the plane of the central surface. Each damper portion 301 and 302 also has a maximum thickness A at the center of the damper 30, and a minimum thickness C at the periphery of the damper 30, as labeled in FIG. 5. In some nonlimiting embodiments, B>D>C. In some nonlimiting embodiments, C is greater than or equal to 5 millimeters. The inclined surface portions of the damper 30 of projected length D advantageously function to smooth the transition of the damper 30 as it moves from the central track region 40 across the end 46 and onto the inclined track region 42 (or vice versa), and similarly functions to smooth the transition of the damper 30 as it moves from the central track region 40 across the end 48 and onto the inclined track region 44 (or vice versa). In some nonlimiting illustrative embodiments, the angle x of the damper 30 indicated in FIG. 5 is less than or equal to the angle y of the track 32 indicated in FIGS. 3 and 4 (i.e., x≤y).

The illustrative damper 30 comprises the two damper portions 301 and 302 separated by the gap 50. This is merely an illustrative example, and in other contemplated embodiments the damper may comprise a single portion, or may comprise three or more portions. Additionally, as the damper 30 is typically made of an engineering plastic with some compressibility, this compressibility enables the surface of the damper 30 to deform to the slight angle of the inclined track portions 42 and 44. Hence, in some alternative embodiments the surface of the damper that contacts the track 32 may be planar without the inclined surface portions of the embodiment of FIG. 5 (that is, in these alternative embodiments the central surface portion may extend the entire length of the damper and the inclined surface portions of projected length D may be omitted entirely).

In the following, operation of the disclosed displacement control assemblies for controlling total displacement during a seismic event is described in further detail. In particular, the action of the inclined track portions 42 and 44 and the optional inclined damper surface portions of projected length D in providing such control is illustrated.

Figure 6:
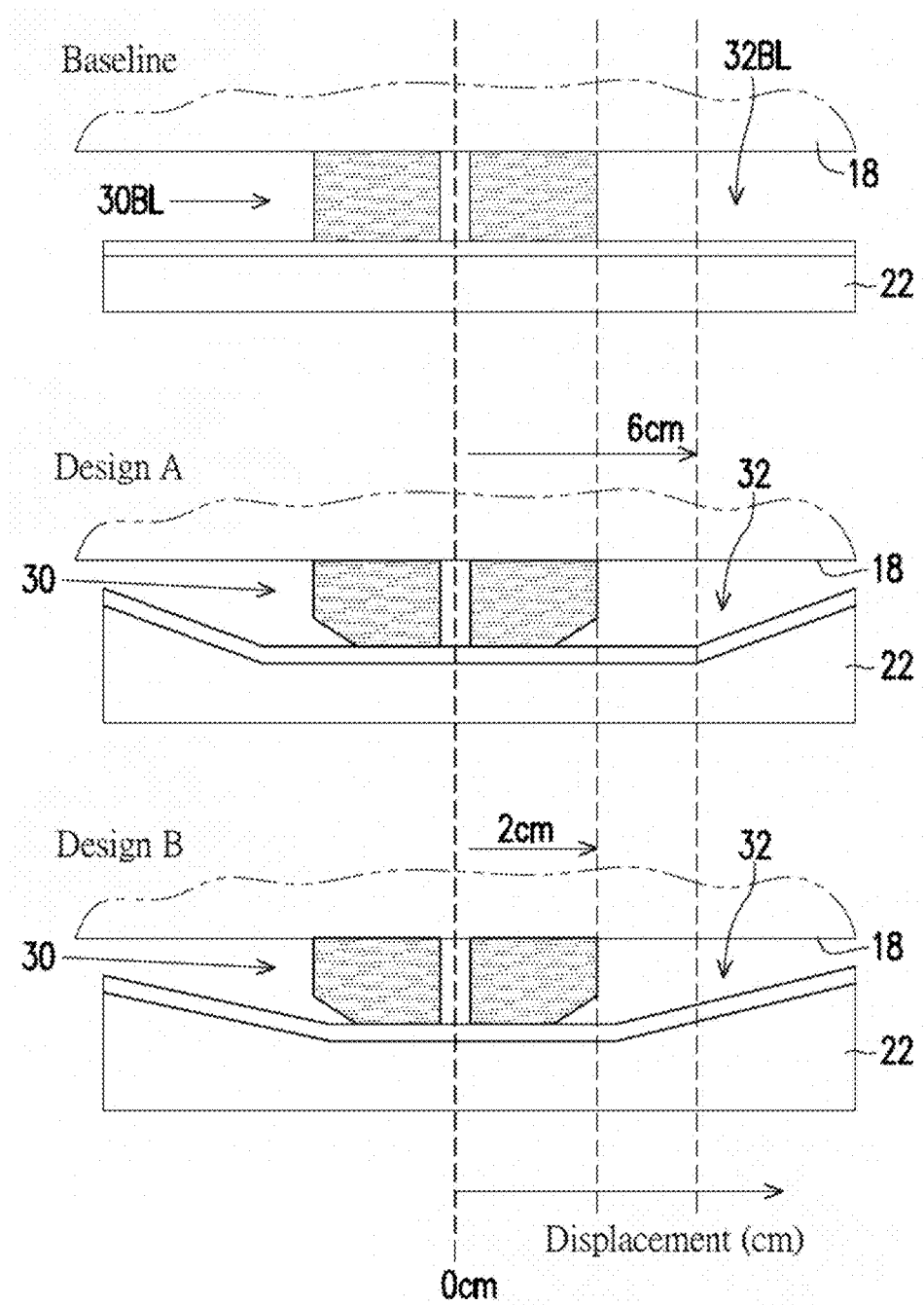
FIG. 6 diagrammatically shows, by way of respective side-sectional views, the damper and track of the embodiment of FIG. 2 ("Design B") along with a damper and track with similar geometry but different dimensions ("Design A") and a baseline damper and track which does not have inclined track portions ("Baseline").

With reference to FIG. 6, three designs of the damper and track are presented for consideration. In a "Baseline" design, the inclined track portions 42 and 44 and inclined damper surface portions of projected length D are omitted entirely. This provides a damper 30BL which slides along a flat track 32BL.

FIG. 6 further illustrates a "Design A" in which the central track portion has a length of 12 centimeters (12 cm). In other words, in "Design A" the central track portion extends outward for 6 cm on either side of a centerline of the track 32 which is designated as the 0 cm position. In a "Design B", the central track portion has a shorter length of 4 cm, that is, in "Design B" the central track portion extends outward for 2 cm on either side of the centerline. "Design A" and "Design B" also differ in that the angle (i.e., angle y labeled in FIG. 4) is different, with the angle y being larger in "Design A" than in "Design B". In other words, the inclined track portions 42 and 44 (labeled in FIGS. 3 and 4) are more strongly inclined in "Design A" than in "Design B". Both "Design A" and "Design B" use the same configuration and dimensions for the damper 30, comprising the two damper portions 301 and 302 of pentagonal cross-section as previously described with reference to FIG. 5.

Figure 7:
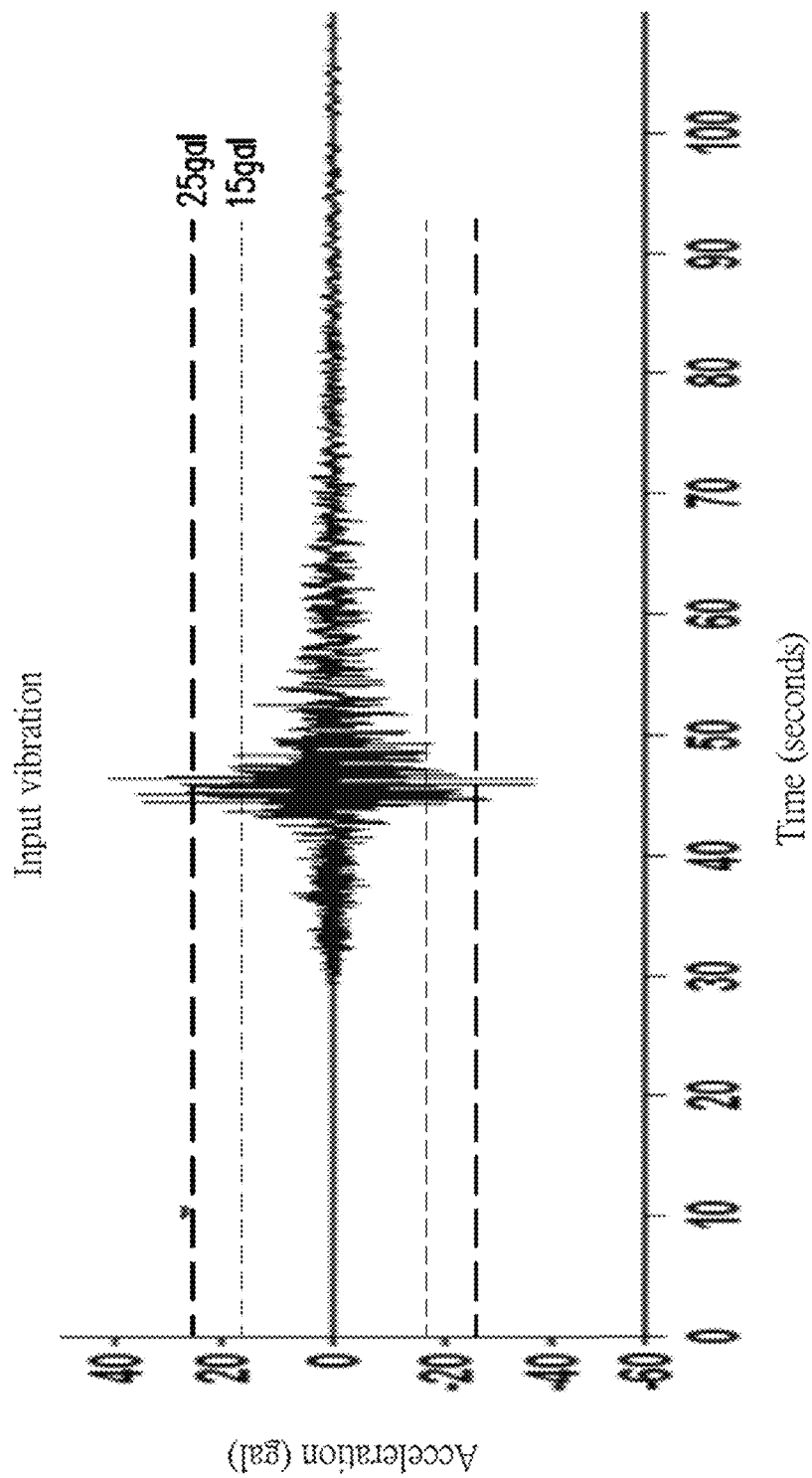
FIG. 7 diagrammatically shows a typical input vibration signal that might occur during a typical seismic event.

With reference to FIG. 7, an illustrative input vibration is shown of a type that might occur during a typical seismic event. The vibration is quantified in terms of the galileo unit (gal) which is a unit of acceleration used in fields such as gravimetry. As seen in FIG. 7, the illustrative input vibration reaches peak energy at a time of around 47 seconds. In the event of an earthquake affecting the semiconductor foundry housing the semiconductor manufacturing tool installation of FIG. 1, the seismic vibration induces displacement of one or both support plates 16 and/or 18 of the support platform 10 (depending on the orientation of the seismic vibrations in Cartesian space).

Figure 8:
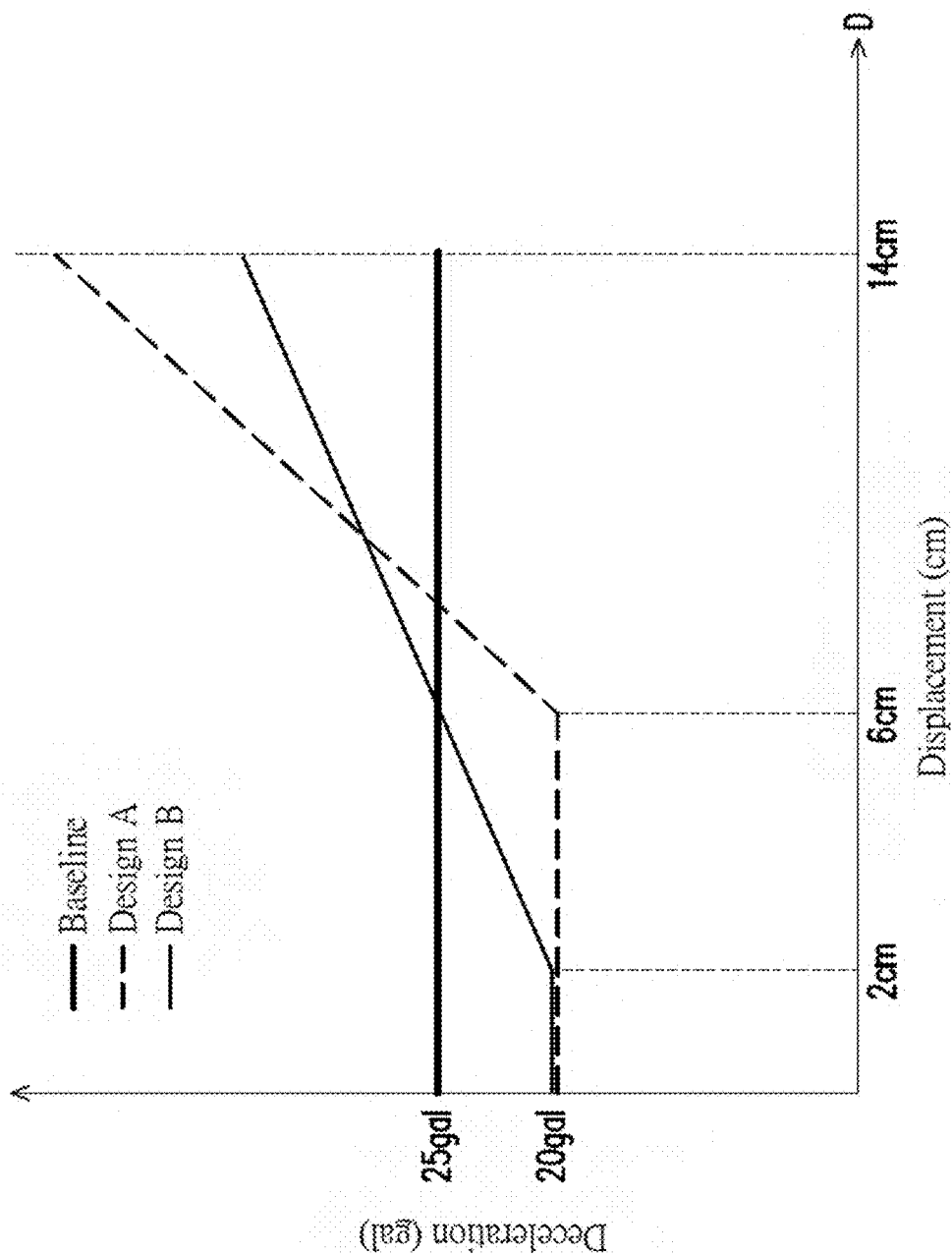
FIG. 8 presents braking force as deceleration versus displacement for Baseline, Design A, and Design B of FIG. 6 responsive to an input vibration.

With reference to FIG. 8, experimental results are shown for a displacement control assembly including the damper frictionally engaged with the track operates to provide a deceleration force, plotted in FIG. 8 for each of the "Baseline" design and "Design A" and "Design B", that opposes an input acceleration vibration. To further understand the deceleration versus displacement responses plotted in FIG. 8, a center deceleration can be defined as the deceleration provided at the centerline point of 0 cm. The magnitude of the center deceleration depends on the magnitude of the force applied by the damper 30BL or damper 30 against the track 32BL or central track portion 40 at the 0 cm point due to the compression of the damper between the support plate 18 and the brake plate 22. This can be adjusted by adjusting the size of the gap between the support plate 18 and the brake plate 22, and/or by adjusting the total thickness A of the damper (see FIG. 5), and/or by choosing the material of the damper to have a desired stiffness (as a stiffer damper will generally provide a higher center deceleration). As seen in FIG. 8, for the examples there presented the center deceleration is set to 25 gal for the "Baseline" design, and is set to 20 gal for each of "Design A" and "Design B". In the plots of FIG. 8, the 0 cm point corresponds to the 0 cm centerline of FIG. 6, and only the values for positive displacement in the range 0-14 cm is plotted, since the values for the negative displacement range (0 to −14 cm) are symmetric about the 0 cm centerline. In these examples, the total length of the track (that is, the dimension G indicated in FIG. 4) is 28 cm. This is merely a nonlimiting illustrative example, and other track lengths can be used depending on the size of the semiconductor manufacturing tool 12 and the size of the support platform 10 (referring back to FIG. 1).

Considering first the "Baseline" design, as seen in FIG. 8 this design provides a constant deceleration of 25 gal over the entire displacement range 0-14 cm (and hence more generally over the entire range −14 cm to 14 cm). Since the deceleration is constant over this entire range and is equal to the center deceleration, it follows that the center deceleration should be set (by adjusting the gap between the support plate edge and the brake plate and/or damper thickness and/or damper material, as previously discussed) so that any credible (i.e. design-basis maximum) seismic acceleration is completely arrested before the displacement reaches the end of the track 32BL (−14 cm or +14 cm in this example). Otherwise, the seismic vibration could drive the displacement to the end of the track (e.g. to the full displacement of 14 cm). At that point, the displacement could be abruptly stopped by a stop located at the end of the track 32BL (for example, if the track 32BL is a groove cut into the brake plate, then the stop would be the end of that groove). However, such an abrupt stop would transfer an acceleration impulse to the supported semiconductor manufacturing tool 12, potentially damaging the tool 12 or introducing other problems such as motion-induced wafer damage, misalignment of precision components of the tool 12, or so forth. Alternatively, if the track 32BL has no stop at the end of the track then the damper 30BL upon reaching and passing the end of the track 32BL (e.g., moving past 14 cm displacement) would run off the track, again likely producing damage to the semiconductor manufacturing tool 12 and in this case also possibly to the support platform 10.

In principle, as previously noted this disadvantageous situation of the displacement reaching the end of the track 32BL can be prevented by increasing the center deceleration to a sufficiently high value by adjusting the gap between the support plate edge and the brake plate and/or damper thickness and/or damper material, as previously discussed, so that no credible seismic acceleration will be sufficient to run the damper from the centerline of the track (0 cm) to the end of the track 32BL. However, this solution introduces a further difficulty. The deceleration plotted in FIG. 8 is produced by kinetic friction between the damper 30BL and the track 32BL as the damper 30BL moves along the track 32BL in response to the seismic vibration. Not shown in the plots of FIG. 8 is that when the seismic event first starts, the static friction between the damper 30BL and track 32BL must be overcome to start the damper 30BL in motion. The static friction is higher than the kinetic friction, an impulse is generated as the static friction is broken, and this impulse can be transmitted to the semiconductor manufacturing tool 12. As the center deceleration is increased, the static friction is correspondingly increased, thus increasing the magnitude of this impulse being transferred to the semiconductor manufacturing tool 12.

The "Baseline" design has yet a further difficulty. Because this design provides a constant deceleration of −25 gal over the entire displacement range (−14 cm to −14 cm in this example), there is no impetus urging the damper 30BL toward the centerline (0 cm) of the track 32BL. Consequently, at the end of a seismic event the damper 30BL could stop generally anywhere along the track 32BL. If, by way of example, it stops at 8 cm along the track, and subsequently another seismic event imparts further motion, there may only be (in this example) 6 cm of travel remaining between the start point of 8 cm initial displacement and the end of the track 32BL at 14 cm. This problem is particularly concerning since it is not uncommon for an earthquake to be followed by one or more aftershocks, that is, one or more smaller earthquakes following an initial large earthquake. In extreme cases, an earthquake swarm can occur, which is a series of earthquakes over a relatively short time frame with no single "main" earthquake.

By contrast to the "Baseline" design with its constant deceleration, "Design A" and "Design B" provide deceleration which increases with distance away from the centerline (0 cm) once the damper 30 moves onto an inclined track portion 42 or 44 (further referencing FIGS. 3 and 4). In "Design A", the edge 48 is located at 6 cm away from the track centerline, and as seen in FIG. 8 from this point on the deceleration increases linearly with increasing displacement. In "Design B", the edge 48 is located at 2 cm away from the track centerline, and again as seen in FIG. 8 from this point on the deceleration increases linearly with increasing displacement. Moreover, "Design A" and "Design B" differ in that the angle of inclination (i.e., angle y indicated in FIG. 4) is larger for "Design A" than for "Design B". By adjusting these two parameters: the edge 48 of the central track portion 40 and the angle y, the starting point of the increasing deceleration and rate of increase of the deceleration can be tuned.

Because of this design, the deceleration close to the centerline (0 cm) can be reduced while still providing strong (and steadily increasing) deceleration as the displacement increases beyond the edge 48 (or beyond the edge 46). This in turn allows the centerline deceleration to be made smaller while still providing sufficient displacement control to ensure the damper 30 cannot reach the end of the track 32 (i.e. cannot reach a displacement of −14 cm or +14 cm in the illustrative example). This is seen in FIG. 8, where displacement control comparable or even better than that provided by the "Baseline" design is obtained with a lower 20 gal deceleration at track center (compared with 25 gal deceleration in the case of the "Baseline" design). The lower centerline deceleration in the central track portion 40 provides for a reduced amount of force to break the static friction of the damper 30 and consequently reduced impulse applied to the supported semiconductor manufacturing tool 12.

As a further benefit, "Design A" and "Design B" provide a centering force. As previously noted, for the "Baseline" design there is no impetus for the damper 30BL to return to a point close to the track centerline (0 cm) at the end of a seismic event. By contrast, in "Design A" and "Design B", the ramping of the deceleration when the damper 30 is on one of the inclined track portions 42 or 44 advantageously provides impetus for the damper 30 to move back to the central track portion 40, that is, to move back toward the track centerline at 0 cm.

While both "Design A" and "Design B" provide these benefits, in some respects "Design B" may be preferable. The movement of the damper 30 across the edge 48 of the central track portion 40 and onto the inclined track portion 44 introduces a non-smooth change in the deceleration at the edge 48. This could produce a small impulse that could be transmitted to the supported semiconductor manufacturing tool 12. As can be seen in FIG. 8, this non-smooth change is sharper for "Design A" than for "Design B". Likewise, the rate of increase in deceleration is slower for "Design B" than for "Design A", which again provides for smoother control of the displacement. In some embodiments, the angle y (see FIG. 4) of the inclined track portions 42 and 44 is 5 degrees or lower to provide relatively smooth transitions across the respective edges 46 and 48 (and similarly for angle x of the damper 30, see FIG. 5). However, a larger value for angle y may be considered if, for example, the total track length must be limited such that a higher rate of increase in deceleration is called for.

In the illustrative track 32 of FIGS. 2-4 and of "Design A" and "Design B" of FIG. 6, the track includes the planar central track portion 40 and planar inclined track portions 42 and 44 extending away from the central track portion 40 on respective first and opposite second sides 46 and 48 of the central track portion 40. As seen in FIG. 8, the planar inclined track portions 42 and 44 produce a linearly increasing deceleration as the damper 30 moves along the planar inclined track portion.

Figure 9:
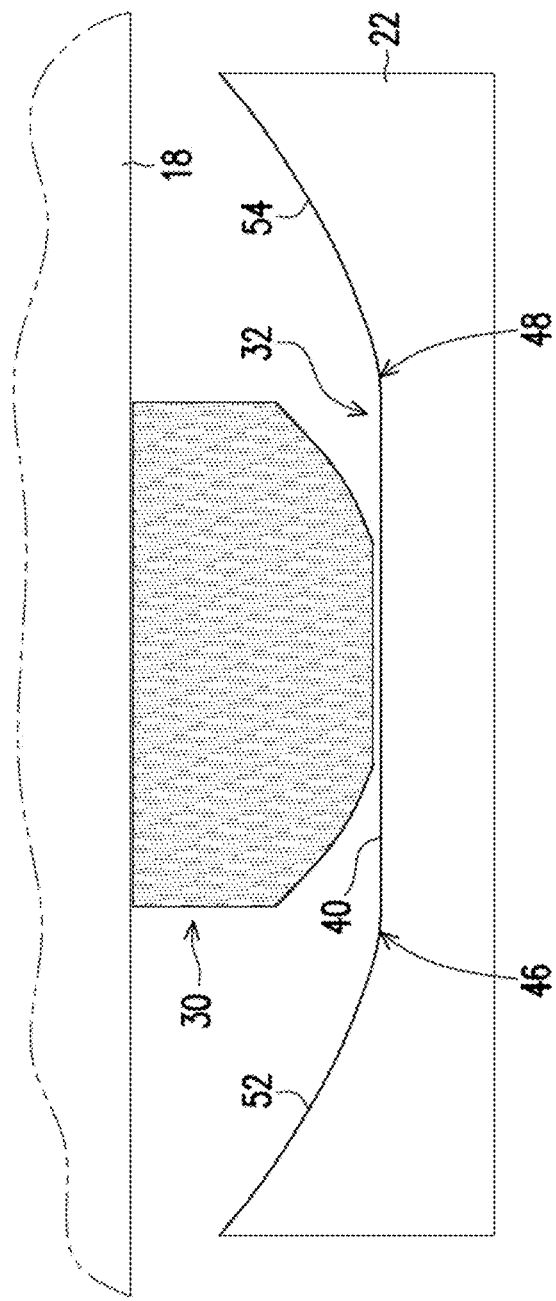
FIG. 9 diagrammatically illustrates a side-sectional view of portions of a support plate and a brake plate, with a damper secured to the support plate and frictionally engaging a track of the brake plate, according to yet another embodiment.

With reference to FIG. 9, in other embodiments the inclined track portions may be other than linear. In the embodiment of FIG. 9, the track 32 includes the planar central portion 40 with end 46 and opposite end 48, as in the embodiment of FIGS. 2-4. However, in the embodiment of FIG. 9, the planar inclined track portion 42 is replaced by a non-planar inclined track portion 52, and likewise the planar inclined track portion 44 is replaced by a non-planar inclined track portion 54. As seen in FIG. 9, the non-planar inclined track portion 42 has a curved inclination in which the inclination increases with increasing (negative) distance from the end 46, and likewise the non-planar inclined track portion 44 has a curved inclination in which the inclination increases with increasing (positive) distance from the end 48. In some nonlimiting illustrative embodiments, the non-planar inclined track portions 52 and 54 may have super-linearly increasing curved surfaces, i.e. the inclined track portions 52 and 54 are concave upward (for the orientation shown in FIG. 9 in which the track faces "upward"). In some nonlimiting illustrative embodiments, the inclined track portions 52 and 54 may have parabolic curved surfaces, for example. Although not plotted, it will be appreciated that in comparison with the linearly increasing deceleration of the damper provided by the planar track portion 44 as depicted in FIG. 8, the deceleration of the damper provided by the non-planar inclined track portion 54 increases with increasing displacement away from the centerline (0 cm). Optionally, the damper 30 may also have non-planar inclined surface portions extending away from the central surface portion, as shown in FIG. 9, so as to better align with the non-planar track portions 52, 54.

In the following, some further embodiments are described.

In a nonlimiting illustrative embodiment, a support platform is configured to support at least a portion of the weight of an associated semiconductor manufacturing tool (such as a furnace) when the associated semiconductor manufacturing tool is disposed on the support platform. The support platform comprises a base, a support plate disposed on the base and configured to move respective to the base, a brake plate arranged in fixed position respective to the base, and a damper secured to one of the support plate or the brake plate and frictionally engaging a track of the other of the support plate or the brake plate. The track includes a central track portion and inclined track portions extending away from the central track portion on respective first and opposite second sides of the central track portion. The inclined track portions are each inclined with respect to the central track portion.

In a nonlimiting illustrative embodiment, a displacement control assembly includes a brake plate, a horizontal support plate that is movable respective to the brake plate in a displacement direction, and a damper secured to one of the horizontal support plate or the brake plate and frictionally engaging a track of the other of the horizontal support plate or the brake plate. The track includes a central track portion and inclined track portions extending away from the central track portion on respective first and opposite second sides of the central track portion. The inclined track portions are each inclined with respect to the central track portion to increase frictional force between the damper and the track with increasing distance of the damper away from the central track portion.

In a nonlimiting illustrative embodiment, a semiconductor manufacturing tool installation includes a semiconductor manufacturing tool, such as a furnace, and a support platform supporting the semiconductor manufacturing tool. The support platform includes displacement control assemblies for controlling displacement of the semiconductor manufacturing tool in respective X and Y directions. Each displacement control assembly includes a brake plate, a support plate bearing at least a portion of the weight of the semiconductor manufacturing tool and movable respective to the brake plate, and a damper secured to one of the support plate or the brake plate and frictionally engaging a track of the other of the support plate or the brake plate. The track includes a central track portion and inclined track portions extending away from the central track portion on respective first and opposite second sides of the central track portion. The inclined track portions are each inclined with respect to the central track portion.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A support platform configured to support at least a portion of the weight of an associated semiconductor manufacturing tool when the associated semiconductor manufacturing tool is disposed on the support platform, the support platform comprising:
   a base;
   a support plate disposed on the base and configured to move respective to the base;
   a brake plate arranged in fixed position respective to the base; and
   a damper secured to one of the support plate or the brake plate and frictionally engaging a track of the other of the support plate or the brake plate;
   wherein:
      the track includes a central track portion which is a planar surface, and inclined track portions extending away from the central track portion on respective first and opposite second sides of the central track portion, and
      the inclined track portions are each inclined with respect to the central track portion.

2. The support platform of claim 1 wherein an inclination of each inclined track portion is effective to increase frictional force between the damper and the track with increasing distance of the damper away from the central track portion.

3. The support platform of claim 1 wherein each of the inclined track portions is a planar surface.

4. The support platform of claim 3 wherein each of the inclined track portions is inclined at an angle of 5 degrees or less with respect to the central track portion.

5. The support platform of claim 3 wherein the damper has a surface including:
   a central surface portion, and
   an inclined surface portion extending away from the central surface portion,
   wherein the inclined surface portion is inclined with respect to the central surface portion.

6. The support platform of claim 5 wherein the inclined surface portion is inclined at an angle of 5 degrees or less with respect to the central surface portion.

7. The support platform of claim 1 wherein the damper is secured to the support plate and frictionally engages the track of the brake plate.

8. The support platform of claim 1 further comprising:
   a second support plate disposed on the support plate and configured to move respective to the support plate orthogonally to the movement of the support plate;
   a second brake plate arranged in fixed position respective to the support plate; and
   a second damper secured to one of the second support plate or the second brake plate and frictionally engaging a second track of the other of the second support plate or the second brake plate;
   wherein:
      the second track includes a central second track portion and inclined second track portions extending away from the central second track portion on respective first and opposite second sides of the central second track portion, and
      the inclined second track portions are each inclined with respect to the central second track portion.

9. A semiconductor manufacturing tool installation comprising:
   the support platform of claim 1; and
   a semiconductor manufacturing tool disposed on the support platform.

10. The semiconductor manufacturing tool installation of claim 9 wherein the semiconductor manufacturing tool comprises a furnace.

11. A displacement control assembly comprising:
    a brake plate;
    a horizontal support plate movable respective to the brake plate in a displacement direction; and
    a damper secured to one of the horizontal support plate or the brake plate and frictionally engaging a track of the other of the horizontal support plate or the brake plate;
    wherein the track includes a central track portion having first and second edges on opposite sides of the central track portion, and first and second inclined track portions extending away from the central track portion and connecting with the respective first and opposite second edges of the central track portion, the first and second inclined track portions each being inclined with respect to the central track portion to increase frictional force between the damper and the track with increasing distance of the damper away from the central track portion.

12. The support platform of claim 11 wherein the central track portion is a planar surface and each of the first and second inclined track portions is a planar surface.

13. The support platform of claim 12 wherein each of the first and second inclined track portions is inclined at an angle of 5 degrees or less with respect to the central track portion.

14. The support platform of claim 12 wherein the damper has a surface including:
    a central surface portion, and
    an inclined surface portion extending away from the central surface portion,
    wherein the inclined surface portion is inclined with respect to the central surface portion.

15. The support platform of claim 11 further comprising:
    a second brake plate arranged in fixed position respective to the horizontal support plate;
    a second horizontal support plate disposed on the support plate and movable respective to the second brake plate in a second displacement direction that is orthogonal to the displacement direction of the horizontal support plate; and
    a second damper secured to one of the second horizontal support plate or the second brake plate and frictionally engaging a second track of the other of the second horizontal support plate or the second brake plate;
    wherein the second track includes a central second track portion and inclined second track portions extending away from the central second track portion on respective first and opposite second sides of the central second track portion, and the inclined second track portions are each inclined with respect to the central second track portion.

16. A semiconductor manufacturing tool installation comprising:
   a semiconductor manufacturing tool; and
   a support platform supporting the semiconductor manufacturing tool, the support platform including displacement control assemblies for controlling displacement of the semiconductor manufacturing tool in respective X- and Y-directions, wherein each displacement control assembly includes:
   a brake plate;
   a support plate bearing at least a portion of the weight of the semiconductor manufacturing tool and movable respective to the brake plate; and
   a damper secured to one of the support plate or the brake plate and frictionally engaging a track of the other of the support plate or the brake plate;
   wherein the track includes a central track portion which is a planar surface and inclined track portions extending away from the central track portion on respective first and opposite second sides of the central track portion, the inclined track portions each being inclined with respect to the central track portion.

17. The semiconductor manufacturing tool installation of claim 16 wherein the inclined track portions are each inclined with respect to the central track portion to increase frictional force between the damper and the track with increasing distance of the damper away from the central track portion.

18. The semiconductor manufacturing tool installation of claim 16 wherein each of the inclined track portions is a planar surface.

19. The semiconductor manufacturing tool installation of claim 18 wherein the damper has a surface including:
   a central surface portion, and
   an inclined surface portion extending away from the central surface portion,
   wherein the inclined surface portion is inclined with respect to the central surface portion.

20. The semiconductor manufacturing tool installation of claim 16 further comprising:
   a second brake plate arranged in fixed position respective to the support plate;
   a second support plate bearing at least a portion of the weight of the semiconductor manufacturing tool and movable respective to the second brake plate, the second support plate being disposed on the support plate and configured to move respective to the support plate orthogonally to the movement of the support plate;
   a second damper secured to one of the second support plate or the second brake plate and frictionally engaging a second track of the other of the second support plate or the second brake plate;
   wherein the second track includes a central second track portion and inclined second track portions extending away from the central second track portion on respective first and opposite second sides of the central second track portion, the inclined second track portions each being inclined with respect to the second central track portion.

* * * * *